United States Patent [19]

Junger

[11] Patent Number: 4,764,741
[45] Date of Patent: Aug. 16, 1988

[54] VOLTAGE AND HIGH FREQUENCY SIGNAL SUPPLY FOR A DIODE MOUNTED IN A WAVEGUIDE

[75] Inventor: Klaus Junger, Allmersbach im Tal, Fed. Rep. of Germany

[73] Assignee: ANT Nachrichtentechnik GmbH, Backnang, Fed. Rep. of Germany

[21] Appl. No.: 768,852

[22] Filed: Aug. 23, 1985

[30] Foreign Application Priority Data

Aug. 24, 1984 [DE] Fed. Rep. of Germany ....... 3431160

[51] Int. Cl.⁴ .............................................. H01P 5/12
[52] U.S. Cl. .................................... 333/250; 333/218; 455/325
[58] Field of Search ..................... 333/218, 250, 33; 331/96, 107 DP, 107 SL; 455/327, 328, 330, 333, 325

[56] References Cited

U.S. PATENT DOCUMENTS

| | | | |
|---|---|---|---|
| 3,470,483 | 9/1969 | Wagner et al. | 455/325 X |
| 3,681,718 | 8/1972 | Kozul et al. | 333/250 |
| 3,718,866 | 2/1973 | Edrich | 333/250 X |
| 3,878,480 | 4/1975 | Hulderman et al. | 331/96 |
| 3,882,396 | 5/1975 | Schneider | 333/250 X |
| 4,006,425 | 2/1977 | Chang et al. | 331/96 X |
| 4,063,186 | 12/1977 | Rubin | 333/250 X |
| 4,156,861 | 5/1979 | DeMambro et al. | 333/250 |
| 4,280,110 | 7/1981 | Cachier et al. | 331/107 DP |
| 4,306,312 | 12/1981 | Cachier | 455/328 |
| 4,392,255 | 7/1983 | Del Giudice | 455/328 |
| 4,426,628 | 1/1984 | Maleck et al. | 331/107 DP X |

FOREIGN PATENT DOCUMENTS

| | | | |
|---|---|---|---|
| 1940902 | 3/1971 | Fed. Rep. of Germany . | |
| 1766787 | 12/1971 | Fed. Rep. of Germany . | |
| 1947942 | 2/1973 | Fed. Rep. of Germany . | |
| 1591569 | 12/1974 | Fed. Rep. of Germany . | |
| 1941453 | 1/1979 | Fed. Rep. of Germany | 455/325 |
| 2745566 | 4/1979 | Fed. Rep. of Germany | 333/247 |
| 3138173 | 5/1983 | Fed. Rep. of Germany . | |
| 3322559 | 1/1985 | Fed. Rep. of Germany . | |
| 2368805 | 5/1978 | France . | |
| 45-35004 | 11/1970 | Japan | 333/247 |
| 0044458 | 4/1979 | Japan | 455/328 |
| 57-75002 | 5/1982 | Japan . | |
| 1103343 | 7/1984 | U.S.S.R. | 455/330 |

OTHER PUBLICATIONS

Tatsuguchi et al,; "An Integrated 18 Ghz Receiver Front End Using a Dielectric Resonator Stabilized Generator and a Subharmonically Pumped Mixer"; 1979, IEEE International Conference on Communication, Part II, 482 P; pp. 26.2.1–26.2.5.

Primary Examiner—Eugene R. LaRoche
Assistant Examiner—Benny Lee
Attorney, Agent, or Firm—Spencer & Frank

[57] ABSTRACT

Circuit device including: a waveguide for transmitting electromagnetic waves with an electric field extending in a selected direction; a diode mounted in the waveguide; a coaxial line connected for supplying a DC voltage to the diode; and a planar line for supplying at least one high frequency signal, the planar line extending perpendicular to the direction of the electric field and projecting into the waveguide, and the line being disposed at a distance from the diode for establishing a capacitive coupling with the diode.

12 Claims, 1 Drawing Sheet

U.S. Patent  Aug. 16, 1988  4,764,741
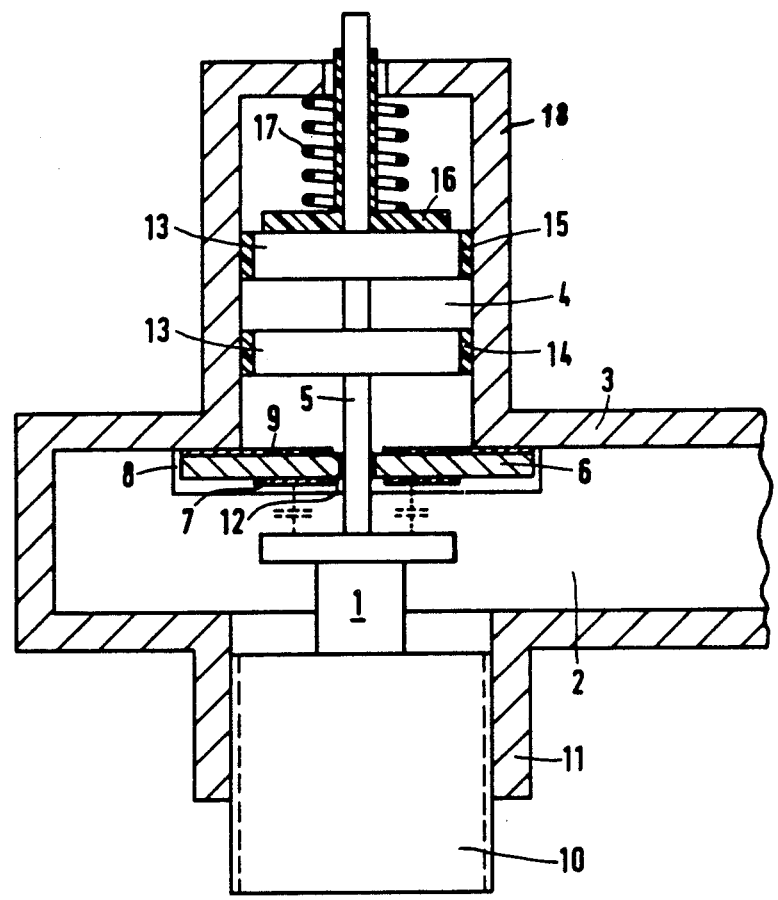

VOLTAGE AND HIGH FREQUENCY SIGNAL SUPPLY FOR A DIODE MOUNTED IN A WAVEGUIDE

BACKGROUND OF THE INVENTION

The present invention relates to a circuit device for supplying a direct voltage and at least one high frequency signal to a diode disposed in a waveguide, the diode being in contact with the inner conductor of a coaxial cable supplying the DC voltage.

Such a device is disclosed in Federal Republic of Germany Application No. 31 38 173 A1. In the parametric amplifier on which this document is based, a coaxial line supplies a diode with a high frequency signal in addition to a DC voltage. The simultaneous coupling of both signals into the coaxial line is relatively complicated. In addition, the spring required to maintain the inner conductor of the coaxial line in contact with the diode can not be prevented from having adverse influence on the high frequency signal, primarily if it is a very high frequency signal (>10 GHz). The coaxial line also has the drawback that it does not offer variable tuning of the diode impedance to the high frequency signal. Variable tuning of the coaxial line would be very difficult, if not impossible, to realize.

SUMMARY OF THE INVENTION

It is now an object of the present invention to provide a device of the above-mentioned type which permits, with simple means, an interference-free and easily tunable supply of DC voltage and high frequency signals for a diode.

The above and other objects are achieved, according to the present invention, by an arrangement including a diode and a planar line carrying a high frequency signal and extending into a waveguide perpendicularly to the electric field lines of the waveguide signal, the planar line being at such a distance from the diode that capacitive coupling exists between the two. Instead of supplying the high frequency signal by a planar line to the diode the high frequency signal can be supplied to the diode via the waveguide; and the planar line is used to deliver a resulting high frequency signal.

The invention will now be described in greater detail with reference to an embodiment that is illustrated in the drawing.

BRIEF DESCRIPTION OF THE DRAWING

The sole FIGURE is a cross-sectional view of a waveguide circuit structure according to a preferred embodiment of the invention.

DESCRIPTION OF THE PREFERRED EMBODIMENTS

The sole FIGURE is a longitudinal sectional view of a frequency multiplier or a frequency divider composed of a diode 1 disposed in a waveguide 2 that is short-circuited at one side. A coaxial line 4 includes an inner conductor 5 which is conductively connected to diode 1. The outer conductor 18 of coaxial line 4 is conductively connected to waveguide 2 at the wide side 3 of waveguide 2 which faces diode 1. This coaxial line 4 serves only to supply diode 1 with DC voltage.

In the case of a frequency multipler device a high frequency signal is coupled capacitively through a planar line 7 into diode 1 separately from the DC voltage supply. Due to the nonlinear characteristics of diode 1, the high frequency signal is subjected to frequency multiplication. Thus the resulting high frequency signal, at a frequency which is a multiple of the input frequency, propagates through waveguide 2. Waveguide 2 is here dimensioned in such a way that it permits propagation only at the multiplied frequency, but not at the original input frequency. The right side of waveguide 2 forms the output to deliver the resulting multiplied high frequency signal.

In the case of a frequency divider the high frequency is fed to the right non short-circuited end of waveguide 2. Diode 1 is a varactor diode, which produces, due to its nonlinear characteristics, a subharmonic frequency. The frequency division here is based on the well know subharmonic mixer principle, described e.g. in IEEE 1979 International Conference on Communications, PT II, 482P at pages 26.2.1-.5. The resulting subharmonic high frequency propagates through planar line 7. Planar line 7 is here dimensioned in such a way that it permits propagation at the subharmonic frequency, but not at the original input frequency fed to waveguide 2.

In the illustrated embodiment, the planar line 7 is a stripline disposed on an insulating substrate 6. Substrate 6 projects into waveguide 2, in a direction perpendicular to the electric field lines of the waves propagating in the waveguide, through an aperture 8 in the wall of the narrow side of the waveguide so as to interfere with the propagating waves as little as possible.

Capacitive coupling exists between stripline 7 carrying the high frequency signal in the case of a frequency multiplier and diode 1. In the case of a frequency divider capacitive coupling also exists between stripline 7 and diode 1 with the only difference that stripline 7 is carrying the resulting frequency divided output signal. The ground surface 9 of substrate 6 is soldered to the wide side 3 of waveguide 2 at its wall facing diode 1 and stripline 7 on substrate 6 faces diode 1. A capacitive reactance component is formed between stripline 7 and diode 1, the magnitude of which depends on the distance between stripline 7 and diode 1, and is utilized to compensate for the inductive reactance of diode 1.

In order to be able to set the capacitive reactance component to a desired value, the distance to which diode 1 projects into waveguide 2, and thus the distance between diode 1 and stripline 7, is variable. For this purpose, diode 1 is seated on a threaded bolt 10 which is rotatably mounted in a threaded sleeve 11 attached to waveguide 2.

Substrate 6, which is disposed above diode 1, is provided with an aperture 12 for the passage of the inner conductor 5 of coaxial line 4, with inner conductor 5 contacting diode 1.

Coaxial line 4 is provided with a radial circuit block 13 so as to block out the high frequency signals. Insulation members 14 and 15 made e.g. of Teflon surrounding the line sections of radial circuit block 13 support inner conductor 5 with respect to the outer conductor of coaxial line 4. Circuit block 13 serves as a blocking circuit for the high frequency signals. Inner conductor 5 is mounted to be axially displaceable. A helical spring 17, insulated from the inner conductor by means of an insulating member 16 made e.g. of Teflon, assures that inner conductor 5 is in secure contact with diode 1 in any possible position of the letter.

The above-described frequency multiplier or frequency divider can be converted to a mixer, or converter, in that, in addition to a DC voltage, an intermediate frequency signal can also be supplied to diode 1 through coaxial line 4, the frequency of the intermediate frequency signal being substantially lower than that of the high frequency signals supplied via line 7. The illustrated embodiment is used for example as a 9/18 GHz frequency multiplier or a subharmonic 18/9 GHz frequency divider. In the case of an 9/18 GHz frequency multiplier the relevant dimensions and elements for example are:

waveguide 2 is a R220, rectangular waveguide with reduced height; height reduction is 2 mm, coaxial line 4 has in inner diameter of 4 mm, thus determining the diameter of circuit block 13, the diode 1 is a step recovery diode of the type BXY 18 AB, which is mounted in waveguide 2 at a distance of about 3 mm apart from the short-circuited left end, the diode side facing stripline 7 has a diameter of 3 mm, and is 8 mm apart from the lower circuit block 13, the width of stripline 7 corresponds to the diameter of before mentioned diode side, the width of substrate 6 and ground surface 9 has to be as large as to cover the whole coaxial line 4 extending into waveguide 2, e.g. 5 mm, circuit block 13 is built up with two metallic cylinders of 3 mm thickness spaced 4 mm apart; the outer circumferences of these cylinders are covered by said Teflon insulation members 14 and 15.

It will be understood that the above description of the present invention is susceptible to various modifications, changes and adaptations, and the same are intended to be comprehended within the meaning and range of equivalents of the appended claims.

What is claimed is:

1. Circuit device comprising: a waveguide for transmitting electromagnetic waves with an electric field extending in a selected direction; a diode mounted in said waveguide; and means connected for supplying a DC voltage and at least one high frequency signal to said diode, said means comprising a coaxial line connected for supplying the DC voltage to said diode, and a planar line for supplying the at least one high frequency signal, said planar line extending perpendicular to the direction of the electric field of said waveguide and projecting into said waveguide, said planar line being disposed at a distance from said diode for establishing a capacitive coupling with said diode, and said waveguide having an output to deliver a resulting high frequency signal, wherein said planar line is provided with an aperture and said coaxial line includes an inner conductor which passes through said aperture and via which said coaxial line is connected to said diode.

2. A circuit device as defined in claim 1, wherein said planar line is conductive.

3. A circuit device as defined in claim 1 further comprising means mounting said diode in said waveguide for varying the extent to which said diode penetrates into said waveguide and thus the distance between said diode and said planar line.

4. A circuit device as defined in claim 1 wherein said planar line is a stripline including an insulating substrate and a flat conductor on said substrate.

5. Circuit device comprising: a waveguide for transmitting electromagnetic waves with an electric field extending in a selected direction; a diode mounted in said waveguide; and means connected for supplying a DC voltage and at least one high frequency signal to said diode, said means comprising a coaxial line connected for supplying the DC voltage to said diode, one end of said waveguide for supplying the at least one high frequency signal, and a planar line for conducting a resulting high frequency signal, said planar line extending perpendicular to the direction of the electric field of said waveguide and projecting into said waveguide, and said line being disposed at a distance from said diode for establishing a capacitive coupling with said diode, wherein said planar line is provided with an aperture and said coaxial line includes an inner conductor which passes through said aperture and via which said coaxial line is connected to said diode.

6. A circuit device as defined in claim 2 further comprising means mounting said diode in said waveguide for varying the extent to which said diode penetrates into said waveguide and thus the distance between said diode and said planar line.

7. A circuit device as defined in claim 2, wherein said planar line is conductive.

8. A circuit device as defined in claim 2 wherein said planar line is a stripline including an insulating substrate and a flat conductor on said substrate.

9. A circuit device comprising: a waveguide for transmitting electromagnetic waves with an electric field extending in a selected direction; a diode mounted in said waveguide; and means connected for supplying a DC voltage and at least one high frequency signal to said diode, said means comprising a coaxial line connected for supplying the DC voltage to said diode, and a planar line for supplying the at least one high frequency signal, said planar line extending perpendicular to the direction of the electric field of said waveguide and projecting into said waveguide, said planar line being disposed at a distance from said diode for establishing a capacitive coupling with said diode, and said waveguide having an output to deliver a resulting high frequency signal, wherein said waveguide is a rectangular waveguide having two opposed wide sides and two opposed narrow sides, and said planar line is secured to one of said wide sides of said waveguide.

10. A circuit device as defined in claim 9 wherein said planar line is a stripline including an insulating substrate having opposed faces, a ground conductor disposed on one face of said substrate and soldered to said one of said wide sides of said waveguide, and a second conductor disposed on the face of said substrate which is opposite said one face and capacitively coupled to said diode.

11. A circuit device comprising: a waveguide for transmitting electromagnetic waves with an electric field extending in a selected direction; a diode mounted in said waveguide; and means connected for supplying a DC voltage and at least one high frequency signal to said diode, said means comprising a coaxial line connected for supplying the DC voltage to said diode, one end of said waveguide for supplying the at least one high frequency signal, and a planar line for conducting a resulting high frequency signal, said planar line extending perpendicular to the direction of the electric field of said waveguide and projecting into said waveguide, and said line being disposed at a distance from said diode for establishing a capacitive coupling with said diode, wherein said waveguide is a rectangular waveguide having two opposed wide sides and two opposed narrow sides, and said planar line is secured to one of said wide sides of said waveguide.

12. A circuit device as defined in claim 10 wherein said planar line is a stripline including an insulating substrate having opposed faces, a ground conductor disposed on one face of said substrate and soldered to said one of said wide sides of said waveguide, and a second conductor disposed on the face of said substrate which is opposite said one face and capacitively coupled to said diode.

* * * * *